(12) United States Patent
Choi et al.

(10) Patent No.: US 11,183,124 B2
(45) Date of Patent: Nov. 23, 2021

(54) SCAN DRIVER AND DISPLAY DEVICE INCLUDING THE SAME

(71) Applicant: Samsung Display Co., LTD., Yongin-si (KR)

(72) Inventors: Yang Hwa Choi, Yongin-si (KR); Bo Yong Chung, Yongin-si (KR); Tak Young Lee, Yongin-si (KR); Sang Uk Lim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/065,075

(22) Filed: Oct. 7, 2020

(65) Prior Publication Data

US 2021/0104197 A1 Apr. 8, 2021

(30) Foreign Application Priority Data

Oct. 8, 2019 (KR) .................. 10-2019-0124826

(51) Int. Cl.
*G09G 3/32* (2016.01)
*G09G 3/3266* (2016.01)
*G09G 3/3233* (2016.01)

(52) U.S. Cl.
CPC ............ *G09G 3/3266* (2013.01); *G09G 3/32* (2013.01); *G09G 3/3233* (2013.01); *G09G 2300/0426* (2013.01); *G09G 2300/08* (2013.01); *G09G 2310/0202* (2013.01); *G09G 2310/0267* (2013.01); *G09G 2310/08* (2013.01)

(58) Field of Classification Search
CPC ... G09G 3/32–3291; G09G 2300/0421; G09G 2300/0426; G09G 2300/0804; G09G 2300/0852; G09G 2310/0264; G09G 2310/0267; G09G 2310/0286; G09G 2310/06; G09G 2310/067; G09G 2310/08; G09G 2320/0233; G09G 2320/0242; G09G 2320/0252; G09G 2320/04; G09G 2320/043; G09G 2320/045

See application file for complete search history.

(56) References Cited

U.S. PATENT DOCUMENTS

| 9,252,747 | B2 | 2/2016 | Chung | |
|---|---|---|---|---|
| 10,878,745 | B2 | 12/2020 | Park et al. | |
| 2016/0293094 | A1* | 10/2016 | Park | G09G 3/20 |
| 2018/0144703 | A1* | 5/2018 | Kim | G09G 3/20 |

(Continued)

FOREIGN PATENT DOCUMENTS

| KR | 10-2013-0135507 | 12/2013 |
|---|---|---|
| KR | 10-2018-0031879 | 3/2018 |

(Continued)

*Primary Examiner* — Nathan Danielsen
(74) *Attorney, Agent, or Firm* — H.C. Park & Associates, PLC

(57) ABSTRACT

A scan driver for a display device includes a plurality of stages outputting scan signals. A first stage of the plurality of stages includes first to sixth transistors connected to a first carry clock line, a carry line, a previous carry line, and a second carry clock line. In a first frame period, the second carry clock line is configured to receive a second carry clock signal having at least one pulse with substantially the same phase as at least one of first pulses of a first carry clock signal to be applied to the first carry clock line.

20 Claims, 10 Drawing Sheets

(56) References Cited

U.S. PATENT DOCUMENTS

| | | | |
|---|---|---|---|
| 2018/0337682 A1* | 11/2018 | Takasugi | G09G 3/3241 |
| 2019/0019462 A1 | 1/2019 | Kim et al. | |
| 2019/0066599 A1* | 2/2019 | Kim | G09G 3/3266 |
| 2019/0130848 A1* | 5/2019 | Kim | G09G 3/3266 |
| 2019/0189060 A1 | 6/2019 | Takasugi | |
| 2020/0184898 A1 | 6/2020 | Choi et al. | |
| 2020/0193912 A1 | 6/2020 | Park et al. | |
| 2020/0219451 A1 | 7/2020 | Kim | |
| 2020/0243018 A1 | 7/2020 | Kim et al. | |
| 2020/0372851 A1 | 11/2020 | Kim et al. | |
| 2020/0410943 A1 | 12/2020 | Kim | |
| 2021/0065617 A1 | 3/2021 | Choi et al. | |
| 2021/0074220 A1 | 3/2021 | Kim et al. | |

FOREIGN PATENT DOCUMENTS

| | | |
|---|---|---|
| KR | 10-2018-0127896 | 11/2018 |
| KR | 10-2019-0009019 | 1/2019 |
| KR | 10-2020-0071206 | 6/2020 |
| KR | 10-2020-0072635 | 6/2020 |
| KR | 10-2020-0085976 | 7/2020 |
| KR | 10-2020-0094895 | 8/2020 |
| KR | 10-2020-0100247 | 8/2020 |
| KR | 10-2020-0135633 | 12/2020 |
| KR | 10-2020-0137072 | 12/2020 |
| KR | 10-2021-0002282 | 1/2021 |
| KR | 10-2021-0027576 | 3/2021 |
| KR | 10-2021-0031568 | 3/2021 |

\* cited by examiner

SCAN DRIVER AND DISPLAY DEVICE INCLUDING IHE SAME

CROSS-REFERENCE TO RELATED APPLICATION

This application claims priority from and the benefit of Korean Patent Application No. 10-2019-0124826, filed on Oct. 8, 2019, which is hereby incorporated by reference for all purposes as if fully set forth herein.

BACKGROUND

Field

Exemplary implementations of the invention relate generally to a display device, and more particularly, to a scan driver included in the display device for outputting a scan signal and a sensing signal.

Discussion of the Background

Each of pixels of a display device may emit light at a luminance corresponding to a data signal input through a data line. The display device may display an image with a combination of light emitting pixels.

Each of the pixels may be connected to a respective data line. Accordingly, a scan driver is required to provide a scan signal for selecting a pixel to which the data signal is to be supplied among the pixels. The scan driver may be provided in the form of a shift register to sequentially provide the scan signal of a turn-on level via a plurality of scan lines.

The above information disclosed in this Background section is only for understanding of the background of the inventive concepts, and, therefore, it may contain information that does not constitute prior art.

SUMMARY

Applicant discovered that a scan driver capable of selectively providing a turn-on level scan signal to only a desired scan line may be desirable, for example, so as to detect mobility information or threshold voltage information of a driving transistor of a pixel. Further, as the non-display area (e.g., dead space) of a display device becomes narrower, the scan driver must be accommodated in a narrower space.

Scan drivers constructed according to the principles and exemplary implementations of the invention are capable of being integrated in a narrower dead space of display devices incorporating the same.

For example, a scan driver constructed according to exemplary embodiments of the invention may include a plurality of stages, wherein the Q node and the QB node of each of the stages may be reset by carry clock signals having the turn-on level at the same time. Thus, the scan driver does not require separate control signals and lines for resetting the Q node and the QB node, and the scan driver can be integrated in a narrower dead space of the display device incorporating the same.

Additional features of the inventive concepts will be set forth in the description which follows, and in part will be apparent from the description, or may be learned by practice of the inventive concepts.

According to an aspect of the invention, a scan driver for a display device includes a plurality of stages to output scan signals. A first stage of the plurality of stages includes: a first transistor having a first electrode connected to a first carry clock line, a second electrode connected to a carry line, and a gate electrode connected to a Q node; a second transistor having a first electrode connected to the carry line, a second electrode connected to a first power line, and a gate electrode connected to a QB node; a third transistor having a first electrode connected to a previous carry line, a second electrode connected to the Q node, and a gate electrode connected to the previous carry line; a fourth transistor having a gate electrode connected to a second carry clock line and a first electrode connected to the QB node; a fifth transistor having a first electrode connected to the Q node and a gate electrode connected to the first carry clock line; and a sixth transistor having a first electrode connected to a second electrode of the fifth transistor, a second electrode connected to the carry line, and a gate electrode connected to the QB node. In a first frame period, the second carry clock line is configured to receive a second carry clock signal having at least one pulse with substantially the same phase as at least one of first pulses of a first carry clock signal to be applied to the first carry clock line.

The first frame period may include a driving period in which the stages are configured to sequentially output the scan signals, and the at least one pulse may include a third pulse occurring at or after the end of the driving period. The second carry clock signal may further have pulses having phases different from the first pulses of the first carry clock signal in the driving period An interval between the third pulse and the second pulses may be less than a period of the second pulses.

The at least one pulse may include a fourth pulse occurring at the start of the driving period.

The first stage may further include: a seventh transistor having a first electrode connected to a first scan clock line, a second electrode connected to a scan line, and a gate electrode connected to the Q node; an eighth transistor having a first electrode connected to the scan line, a second electrode connected to a second power line, and a gate electrode connected to the QB node; and a first capacitor connected between the Q node and the scan line.

The first stage may further include a ninth transistor having a first electrode connected to the Q node and a gate electrode connected to a next carry line connected to the first power line.

The first stage may further include a tenth transistor having a first electrode connected to the second carry clock line, a second electrode connected to the QB node, and a gate electrode connected to the Q node.

The tenth transistor may include: a first sub transistor having a first electrode connected to the second carry clock line and a gate electrode connected to the Q node; and a second sub transistor having a first electrode connected to a second electrode of the first sub transistor, a second electrode connected to the QB node, and a gate electrode connected to the Q node. In this case, the first stage may further include a eleventh transistor having a first electrode connected to the second electrode of the first sub transistor, a second electrode connected to a third power line, and a gate electrode connected to the QB node.

The first stage may further include: a twelfth transistor having a first electrode connected to a first sensing clock line, a second electrode connected to a sensing line, and a gate electrode connected to the Q node; a thirteenth transistor having a first electrode connected to the sensing line, a second electrode connected to the second power line, and a gate electrode connected to the QB node; and a second capacitor connected between the Q node and the sensing line.

The first stage may further include: a fourteenth transistor having a first electrode connected to a first node, a second electrode connected to the carry line, and a gate electrode connected to a first control line; a third capacitor connected between the third power line and the first node; a fifteenth transistor having a first electrode connected to the third power line, and a gate electrode connected to the first node; and a sixteenth transistor having a first electrode connected to a second electrode of the fifteenth transistor, a second electrode connected to the Q node, and a gate electrode connected to a second control line.

The fourteenth transistor may include: a third sub transistor having a first electrode connected to the first node, and a gate electrode connected to the first control line; and a fourth sub transistor having a first electrode connected to a second electrode of the third sub transistor, a second electrode connected to the carry line, and a gate electrode connected to the first control line. In this case, the first stage may further include a seventeenth transistor having a first electrode connected to the third power line, a second electrode connected to the second electrode of the third sub transistor, and a gate electrode connected to the first node.

The third transistor may include: a fifth sub transistor having a first electrode connected to the previous carry line, a second electrode connected to a second node, and a gate electrode connected to the previous carry line; and a sixth sub transistor having a first electrode connected to the second electrode of the fifth sub transistor, a second electrode connected to the Q node, and a gate electrode connected to the previous carry line. The ninth transistor may include: a seventh sub transistor having a first electrode connected to the Q node, a second electrode connected to the second node, and a gate electrode connected to the next carry line; and an eighth sub transistor having a first electrode connected to the second electrode of the seventh sub transistor, a second electrode connected to the first power line, and a gate electrode connected to the next carry line. The sixteenth transistor may include: a ninth sub transistor having a first electrode connected to the first electrode of the fifteenth transistor, a second electrode connected to the second node, and a gate electrode connected to the second control line; and a tenth sub transistor having a first electrode connected to the second electrode of the ninth sub transistor, a second electrode connected to the Q node, and a gate electrode connected to the second control line. In this case, the first stage may further include an eighteenth transistor having a first electrode connected to the second node, a second electrode connected to the third power line, and a gate electrode connected to the Q node.

The stages may include odd-numbered stages and even-numbered stages, and when the first stage is included in the odd-numbered stages, the first stage may be connected to a previous stage and a next stage adjacent to each other of the odd-numbered stages through the previous carry line and the next carry line, respectively.

The last stage of the stages may not be connected to the next carry line.

A node voltage of the Q node of the last stage of the stages may be changed from a high level to a low level by the at least one pulse having substantially the same phase.

According to another aspect of the invention, a scan driver for a display device includes a plurality of stages to output scan signals. A first stage of the plurality of stages includes: a first transistor having a first electrode connected to a first carry clock line, a second electrode connected to a carry line, and a gate electrode connected to a Q node; a second transistor having a first electrode connected to the carry line, a second electrode connected to a first power line, and a gate electrode connected to a QB node; a third transistor having a first electrode connected to a previous carry line, a second electrode connected to the Q node, and a gate electrode connected to the previous carry line; a fourth transistor having a gate electrode connected to a second carry clock line and a first electrode connected to the QB node; a fifth transistor having a first electrode connected to the Q node and a gate electrode connected to the first carry clock line; and a sixth transistor having a first electrode connected to a second electrode of the fifth transistor, a second electrode connected to the QB node, and a gate electrode connected to the QB node. In a first frame period, the second carry clock line is configured to receive a second carry clock signal having at least one pulse with substantially the same phase as at least one of first pulses of a first carry clock signal to be applied to the first carry clock line.

According to still another aspect of the invention, a display device includes: a pixel unit including scan lines and pixels connected to the scan lines; a scan driver including a plurality of stages providing scan signals to the scan lines; and a controller configured to provide a clock signal and a control signal to the scan driver. A first stage of the plurality of stages includes: a first transistor having a first electrode connected to a first carry clock line, a second electrode connected to a carry line, and a gate electrode connected to a Q node; a second transistor having a first electrode connected to the carry line, a second electrode connected to a first power line, and a gate electrode connected to a QB node; a third transistor having a first electrode connected to a previous carry line, a second electrode connected to the Q node, and a gate electrode connected to the previous carry line; a fourth transistor having a gate electrode connected to a second carry clock line and a first electrode connected to the QB node; a fifth transistor having a first electrode connected to the Q node and a gate electrode connected to the first carry clock line; a sixth transistor having a first electrode connected to a second electrode of the fifth transistor, a second electrode connected to the QB node, and a gate electrode connected to the QB node; a seventh transistor having a first electrode connected to a first scan clock line, a second electrode connected to a scan line, and a gate electrode connected to the Q node; an eighth transistor having a first electrode connected to the scan line, a second electrode connected to a second power line, and a gate electrode connected to the QB node; and a first capacitor connected between the Q node and the scan line. In a first frame period, the timing controller is configured to generate a second carry clock signal applied to the second carry clock line, with the second carry clock signal having at least one pulse with substantially the same phase as at least one of first pulses of a first carry clock signal to be applied to the first carry clock line.

The first frame period may include a driving period in which the scan signals are sequentially output, and the at least one pulse may include a third pulse occurring at or after the end of the driving period.

The pixel unit may further include sensing lines connected to the pixels, the scan driver may be configured to apply sensing signals to the sensing lines, and each of the pixels may include: a first thin film transistor having a first electrode connected to a first power source, a second electrode connected to a source node, and a gate electrode connected to a gate node; a second thin film transistor having a first electrode connected to a data line, a second electrode connected to the gate node, and a gate electrode connected to one of the scan lines; a third thin film transistor having a first electrode connected to a receiving line, a second electrode connected to the source node, and a gate electrode connected to one of the sensing lines; a storage capacitor connected between the gate node and the source node; and a light emitting device connected between the source node and a second power source.

The first stage may further include: a twelfth transistor having a first electrode connected to a first sensing clock line, a second electrode connected to a sensing line, and a gate electrode connected to the Q node; a thirteenth transistor having a first electrode connected to the sensing line, a second electrode connected to the second power line, and a gate electrode connected to the QB node; a second capacitor connected between the Q node and the sensing line; a fourteenth transistor having a first electrode connected to a first node, a second electrode connected to the carry line, and a gate electrode connected to a first control line; a third capacitor connected between a third power line and the first node; a fifteenth transistor having a first electrode connected to the third power line, and a gate electrode connected to the first node; and a sixteenth transistor having a first electrode connected to a second electrode of the fifteenth transistor, a second electrode connected to the Q node, and a gate electrode connected to a second control line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
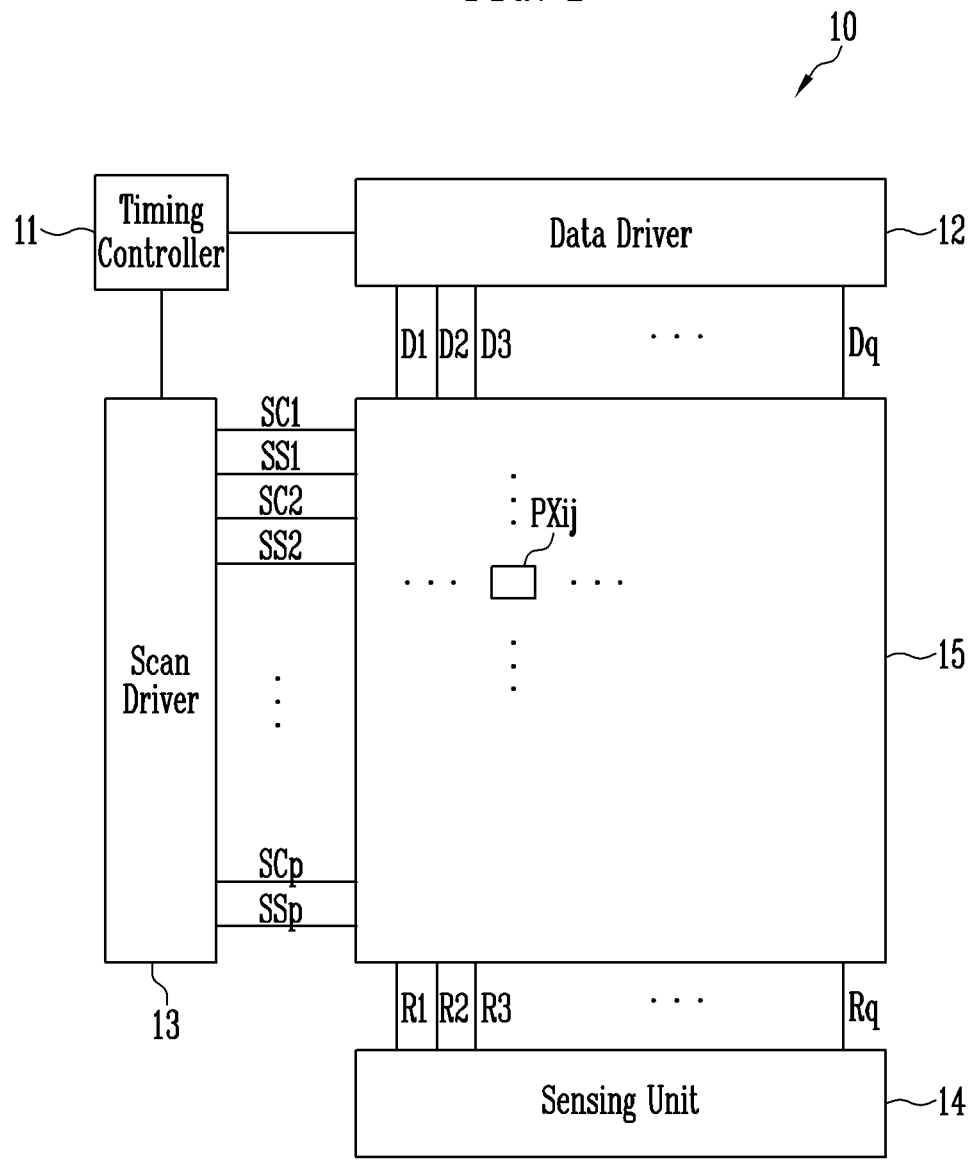
FIG. 1 is a block diagram of an exemplary embodiment of a display device constructed according to the principles of the invention.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As is used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

FIG. 1 is a block diagram of an exemplary embodiment of a display device constructed according to the principles of the invention.

Referring to FIG. 1, a display device 10 may include a timing controller 11, a data driver 12, a scan driver 13, a sensing unit 14 (or sensing circuit, sensor), and a pixel unit 15 (or display panel).

The timing controller 11 may provide grayscale values, a control signal, and the like to the data driver 12. In addition, the timing controller 11 may provide a clock signal, a control signal, and the like to each of the scan driver 13 and the sensing unit 14.

The data driver 12 may generate data signals using the grayscale values, the control signal, and the like received from the timing controller 11. For example, the data driver 12 may sample the grayscale values by using a clock signal, and apply the data signals corresponding to the gray scale values to data lines D1 to Dq in pixel row units, where q is a positive integer.

The scan driver 13 may receive the clock signal, the control signal, and the like from the timing controller 11 to generate scan signals to be provided to scan lines SC1, SC2, . . . , and SCp, where p is a positive integer. For example, the scan driver 13 may sequentially provide the scan signals having pulses of a turn-on level (a turn-on voltage level or a gate-on voltage level) to the scan lines SC1 to SCp. For example, the scan driver 13 may generate the scan signals by sequentially transmitting the pulses of the turn-on level to the next stage according to the clock signal. For example, the scan driver 13 may be configured in the form of a shift register.

In addition, the scan driver 13 may generate sensing signals to be provided to sensing lines SS1, SS2, . . . , and SSp. For example, the scan driver 13 may sequentially provide the sensing signals having pulses of a turn-on level to the sensing lines SS1 to SSp. For example, the scan driver 13 may generate the sensing signals by sequentially transmitting the pulses of the turn-on level to the next stage according to the clock signal.

However, the above-described operation of the scan driver 13 is related to an operation in a driving period P_DISP shown in FIG. 7, and an operation in a blank period P_BLANK (or a sensing period) will be described separately.

The sensing unit 14 may measure deterioration information of pixels according to a current or voltage received through receiving lines R1, R2, R3, . . . , and Rq. For example, the deterioration information of the pixels may be mobility information and threshold voltage information of driving transistors, deterioration information of a light emitting device, and the like. In addition, the sensing unit 14 may measure characteristic information of the pixels according to an environment of the current or voltage received through the receiving lines R1 to Rq. For example, the sensing unit 14 may measure changed characteristic information of the pixels according to temperature or humidity.

The pixel unit 15 may include the pixels. Each pixel Pxij, where i and j are positive integers, may be connected to each corresponding data line, scan line, sensing line, and receiving line. The pixel PXij may refer to a pixel circuit in which a scan transistor is connected to an i-th scan line and a j-th data line.

Figure 2:
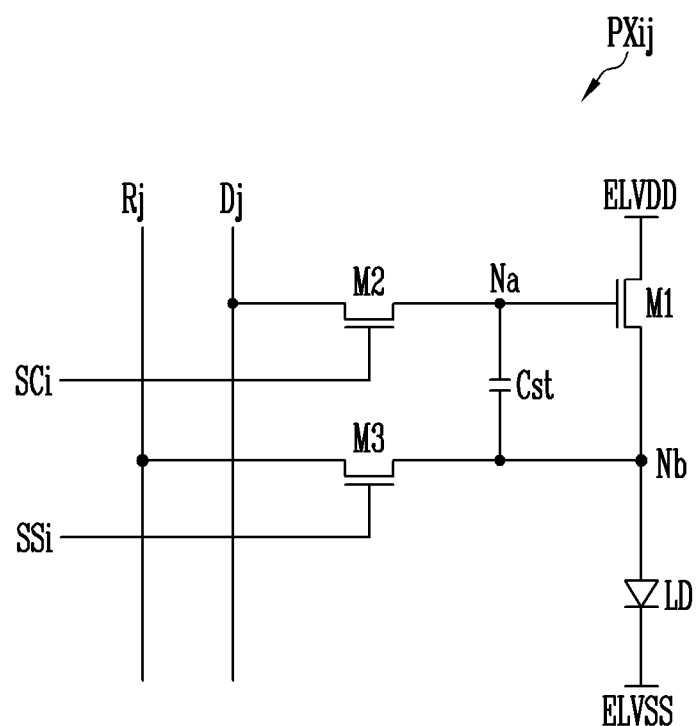
FIG. 2 is a circuit diagram of a representative pixel of the display device of FIG. 1.

FIG. 2 is a circuit diagram of a representative pixel of the display device of FIG. 1.

Referring to FIG. 2, the pixel PXij may include thin film transistors M1, M2, and M3 (switching elements or transistors), a storage capacitor Cst, and a light emitting device LD. The thin film transistors M1, M2, and M3 may be N-type transistors.

The first thin film transistor M1 may include a gate electrode connected to a gate node Na, one electrode (or a first electrode) connected to a power line ELVDD (or a first power source), and the other electrode (or a second electrode) connected to a source node Nb. The first thin film transistor M1 may be referred to as a driving transistor.

The second thin film transistor M2 may include a gate electrode connected to a scan line SCi, one electrode connected to a data line Dj, and the other electrode connected to the gate node Na. The second thin film transistor M2 may be referred to as a switching transistor, a scan transistor, or the like.

The third thin film transistor M3 may include a gate electrode connected to a sensing line SSi, one electrode connected to a receiving line Rj, and the other electrode connected to the source node Nb. The third thin film transistor M3 may be referred to as an initialization transistor, a sensing transistor, or the like.

The storage capacitor Cst may include one electrode connected to the gate node Na, and the other electrode connected to the source node Nb.

The light emitting device LD (or light emitting element) may include an anode electrode connected to the source node Nb, and a cathode electrode connected to a power line ELVSS (or a second power source). The light emitting device LD may be formed of an organic light emitting diode, an inorganic light emitting diode, or the like.

Figure 3:
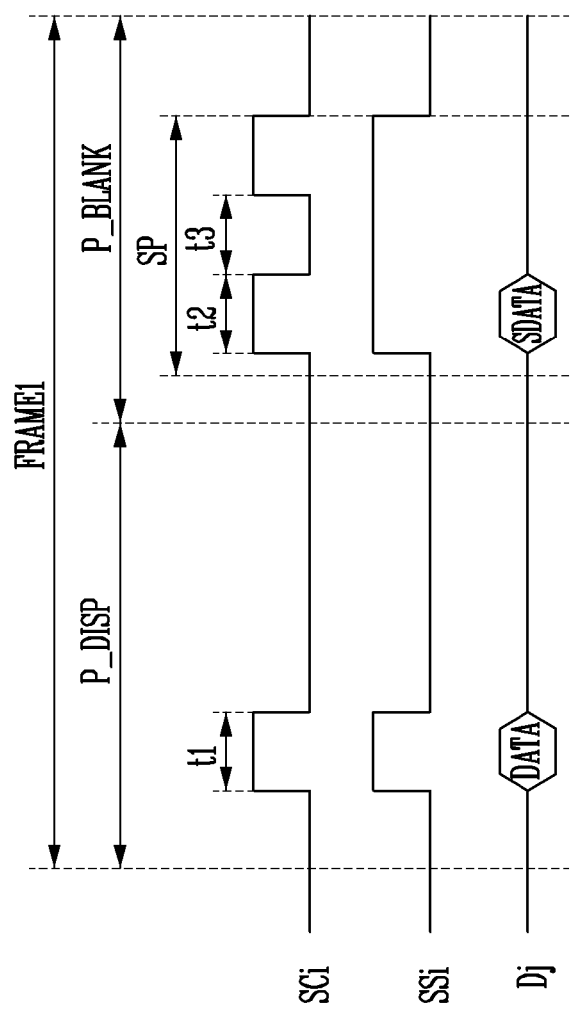
FIG. 3 is an exemplary timing diagram illustrating an example of an operation of the pixel of FIG. 2.

FIG. 3 is an exemplary timing diagram illustrating an example of an operation of the pixel of FIG. 2. FIG. 3 shows a scan signal, a sensing signal, and a data signal provided to the scan line SCi, the sensing line SSi, and the data line Dj connected to the pixel Pxij of FIG. 2 during one frame FRAME1, respectively.

Referring to FIGS. 2 and 3, the frame FRAME1 may include the driving period P_DISP (or a display period) and the blank period P_BLANK (or a vertical blank period), and the blank period P_BLANK may include a sensing period SP.

During a first period t1 within the driving period P_DISP, the scan signal having a turn-on level may be applied to the scan line SCi and the sensing signal having a turn-on level may be applied to the sensing line SSi. In addition, the data signal DATA corresponding to a specific grayscale value may be applied to the data line Dj.

In this case, the second thin film transistor M2 may be turned on in response to the scan signal, and the data signal DATA may be provided to one electrode of the storage capacitor Cst. In addition, the third thin film transistor M3 may be turned on in response to the sensing signal, and a first reference voltage applied to the receiving line Rj may be provided to the other electrode of the storage capacitor Cst. Therefore, a voltage corresponding to the difference between the data signal DATA and the first reference voltage may be stored in the storage capacitor Cst. Subsequently, when the second and third thin film transistors M2 and M3 are turned off, the amount of driving current flowing through the first thin film transistor M1 is determined according to the voltage stored in the storage capacitor Cst, and the light emitting device LD may emit light with luminance corresponding to the amount of the driving current.

During a second period t2 within the blank period P_BLANK (or the sensing period SP), the scan signal having the turn-on level may be applied to the scan line SCi and the sensing signal having the turn-on level may be applied to the sensing line SSi. In addition, a sensing signal SDATA (or a sensing voltage) may be applied to the data line Dj. For example, the sensing signal SDATA may be a black grayscale voltage.

In this case, the second thin film transistor M2 may be turned on in response to the scan signal, and the third thin film transistor M3 may be turned on in response to the sensing signal. Accordingly, the sensing unit 14 (refer to FIG. 1) may measure deterioration information or characteristic information of the pixels according to a current value or a voltage value received through the receiving line Rj.

During a third period t3, the scan signal having a turn-off level may be applied to the scan line SCi and the second thin film transistor M2 may be turned off. On the other hand, during the third period t3, the sensing signal having a turn-on level may be applied to the sensing line SSi and the third thin film transistor M3 may be turned on. Accordingly, a predetermined current may be applied to the receiving line Rj, and may be applied to the anode electrode of the light emitting device LD through the third thin film transistor M3. Therefore, the sensing unit 14 (refer to FIG. 1) may measure the voltage of the anode electrode of the light emitting device LD (that is, deterioration information of the light emitting device LD) through the receiving line Rj.

Figure 4:
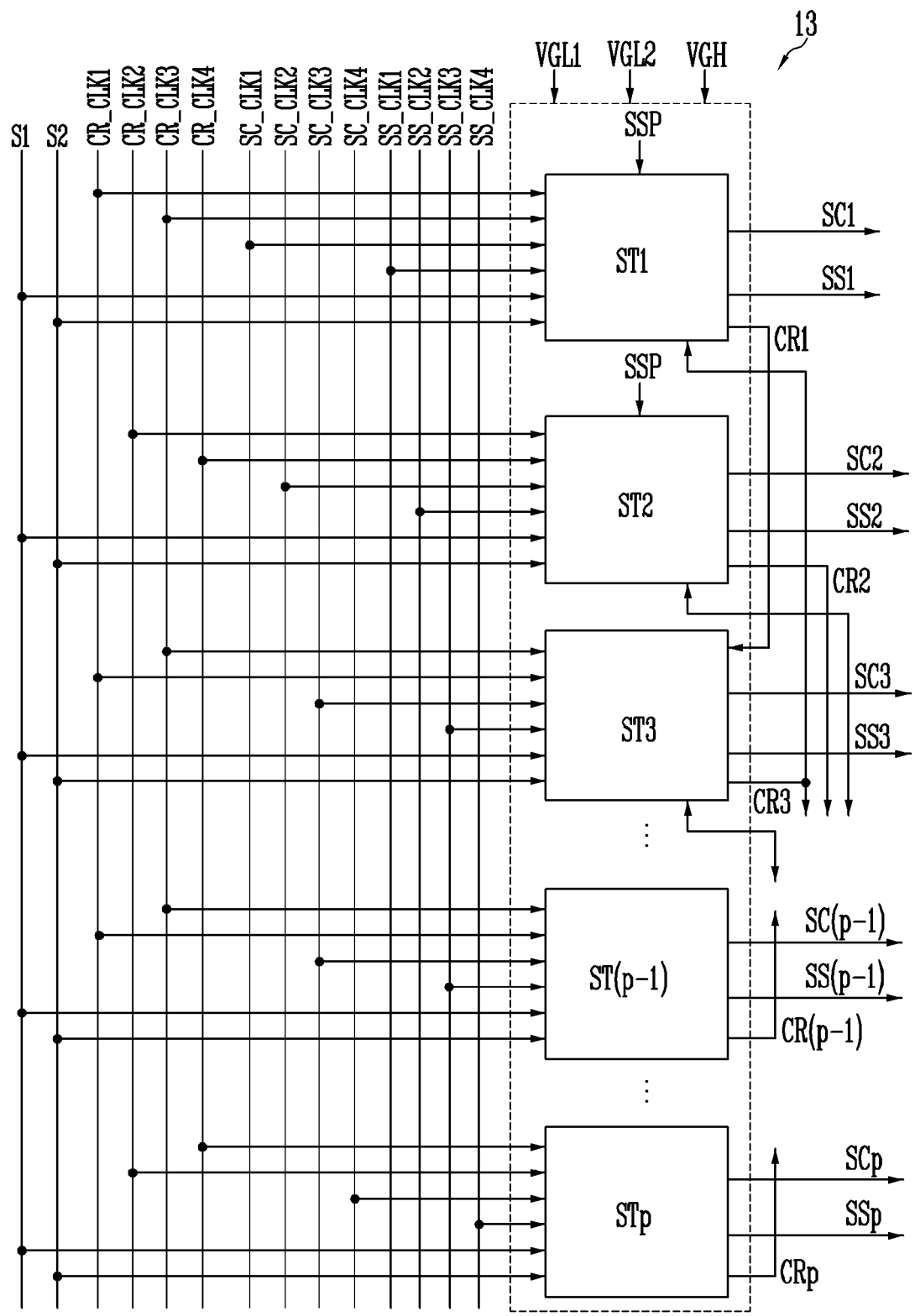
FIG. 4 is a block diagram of an exemplary embodiment of a scan driver constructed according to the principles of the invention.

FIG. 4 is a block diagram of an exemplary embodiment of a scan driver constructed according to the principles of the invention.

Referring to FIG. 4, the scan driver 13 may include a plurality of stages ST1 to STp (or scan stages). Each of the stages ST1 to STp may correspond to or be connected to each of the scan lines SC1 to SCp (and the sensing lines SS1 to SSp) described with reference to FIG. 1.

The stages ST1 to STp may be connected to a first control line S1 and a second control line S2. Common control signals may be applied to the stages ST1 to STp through the first control line S1 and the second control line S2.

Each of the stages ST1 to STp may be connected to corresponding scan clock lines among scan clock lines SC_CLK1, SC_CLK2, SC_CLK3, and SC_CLK4, corresponding sensing clock lines among sensing clock lines SS_CLK1, SS_CLK2, SS_CLK3, and SS_CLK4, and corresponding carry clock lines among carry clock lines CR_CLK1, CR_CLK2, CR_CLK3, and CR_CLK4.

For example, referring to FIG. 4, the first stage ST1 may be connected to the first scan clock line SC_CLK1, the first sensing clock line SS_CLK1, and the first carry clock line CR_CLK1 and the third carry clock line CR_CLK3. The second stage ST2 may be connected to the second scan clock line SC_CLK2, the second sensing clock line SS_CLK2, and the second carry clock line CR_CLK2 and the fourth carry clock line CR_CLK4. The third stage ST3 may be connected to the third scan clock line SC_CLK3, the third sensing clock line SS_CLK3, and the third carry clock line CR_CLK3 and the first carry clock line CR_CLK1. A (p−1)th stage ST(p−1) may be connected to the third scan clock line SC_CLK3, the third sensing clock line SS_CLK3, and the third carry clock line CR_CLK3 and the first carry clock line CR_CLK1. A p-th stage STp may be connected to the fourth scan clock line SC_CLK4, the fourth sensing clock line SS_CLK4, and the fourth carry clock line CR_CLK4 and the second carry clock line CR_CLK2. Here, p may be a multiple of four. That is, in units of four stages, each of the stages ST1 to STp may be connected to corresponding scan clock lines among the scan clock lines SC_CLK1, SC_CLK2, SC_CLK3, and SC_CLK4, corresponding sensing clock lines among the sensing clock lines SS_CLK1, SS_CLK2, SS_CLK3, and SS_CLK4, and corresponding carry clock lines among the carry clock lines CR_CLK1, CR_CLK2, CR_CLK3, and CR_CLK4.

Input signals for respective stages ST1 to STp may be applied to the first control line S1, the second control line S2, the first to fourth scan clock lines SC_CLK1 to SC_CLK4, the first to fourth sensing clock lines SS_CLK1 to SS_CLK4, and the first to fourth carry clock lines CR_CLK1 to CR_CLK4.

In addition, the stages ST1 to STp may receive the first power source through a first power line VGL1, the second power source through a second power line VGL2, and a third power source through a third power line VGH. The first power source, the second power source, and the third power source may be provided from a power supply unit located outside the scan driver 13. Here, the second power source from the second power line VGL2 may have a lower voltage level than the first power source from first power line VGL1, and the third power source from third power line VGH may have a higher voltage level than the first power source first power line VGL1.

The stages ST1 to STp may be connected to corresponding lines among the scan lines SC1 to SCp, the sensing lines SS1 to SSp, and carry lines CR1 to CRp.

For example, the first stage ST1 may be connected to the first scan line SC1, the first sensing line SS1, and a first carry line CR1. The second stage ST2 may be connected to the second scan line SC2, the second sensing line SS2, and a second carry line CR2. The third stage ST3 may be connected to the third scan line SC3, the third sensing line SS3, and a third carry line CR3. The (p−1)th stage ST(p−1) may be connected to a (p−1)th scan line SC(p−1), a (p−1)th sensing line SS(p−1), and a (p−1)th carry line CR(p−1). The p-th stage STp may be connected to a p-th scan line SCp, a p-th sensing line SSp, and a p-th carry line CRp.

Output signals generated by the stages ST1 to STp may be applied to the scan lines SC1 to SCp, the sensing lines SS1 to SSp, and the carry lines CR1 to CRp.

Figure 5:
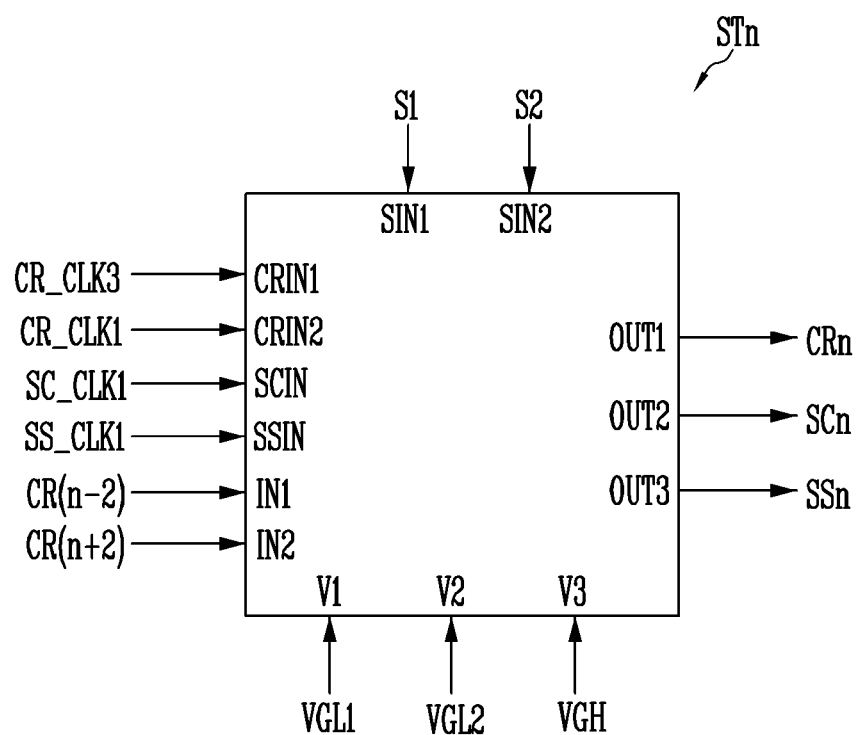
FIG. 5 is a schematic diagram of an exemplary embodiment of a stage included in the scan driver of FIG. 4.

FIG. 5 is a schematic diagram of an exemplary embodiment of a stage included in the scan driver of FIG. 4. FIG. 5 shows an n-th stage STn (where n is a positive integer less than or equal to p). Since the first to p-th stages ST1 to STp are substantially the same or similar to each other, the n-th stage STn, which may include all of the first to p-th stages ST1 to STp, will be described as a representative example.

Referring to FIGS. 4 and 5, the n-th stage STn may include first and second carry clock input terminals CRIN1 and CRIN2, a scan clock input terminal SCIN, a sensing clock input terminal SSIN, first to third power input terminals V1, V2 and V3, first and second control signal input terminals SIN1 and SIN2, first and second input terminals IN1 and IN2, and first to third output terminals OUT1 and OUT2, and OUT3.

The first and second carry clock input terminals CRIN1 and CRIN2 may receive carry clock signals having a phase difference of one-half cycle from each other among first to fourth clock signals applied to the first to fourth carry clock lines CR_CLK1 to CR_CLK4. For example, the first carry clock input terminal CRIN1 may be connected to the third carry clock line CR_CLK3 and receive a third carry clock signal, and the second carry clock input terminal CRIN2 may be connected to the first carry clock line CR_CLK1 and receive a first carry clock signal. For example, the timing controller 11 shown in FIG. 1 may generate the clock signals (or carry clock signals) and provide them to the scan driver 13.

The scan clock input terminal SCIN may receive one of first to fourth scan clock signals applied to the first to fourth scan clock lines SC_CLK1 to SC_CLK4. For example, the scan clock input terminal SCIN may be connected to the first scan clock line SC_CLK1 and receive the first scan clock signal. The first scan clock signal provided to the scan clock input terminal SCIN may be a signal synchronized with the first carry clock signal provided to the second carry clock input terminal CRIN2 during the driving period (P_DISP shown in FIG. 3). In the same manner, the timing controller 11 may generate the scan clock signals and provide them to the scan driver 13.

The sensing clock input terminal SSIN may receive any one of first to fourth sensing clock signals applied to the first to fourth sensing clock lines SS_CLK1 to SS_CLK4. For example, the sensing clock input terminal SSIN may be connected to the first sensing clock line SS_CLK1 and receive the first sensing clock signal. The first sensing clock signal provided to the sensing clock input terminal SSIN may be a signal synchronized with the first carry clock signal provided to the second carry clock input terminal CRIN2 during the driving period. In the same manner, the timing controller 11 may generate the sensing clock signals and provide them to the scan driver 13.

The first power input terminal V1 may be connected to the first power line VGL1, the second power input terminal V2 may be connected to the second power line VGL2, and the third power input terminal V3 may be connected to the third power line VGH.

The first control signal input terminal SIN1 may be connected to the first control line S1 to receive a first control signal, and the second control signal input terminal SIN2 may be connected to the second control line S2 to receive a second control signal.

The first input terminal IN1 may be connected to an (n−2)th carry line CR(n−2) (or a previous carry line connected to an output terminal of a previous stage) and receive a carry signal of the previous stage. Here, the previous stage may be a stage for receiving the carry signal before the n-th stage STn, and may be, for example, an (n−2)th stage.

In an exemplary embodiment, each of the first stage ST1 and the second stage ST2 may receive a scan start signal SSP (refer to FIG. 4) (or a start pulse) as the carry signal of the previous stage.

The second input terminal IN2 may be connected to an (n+2)th carry line CR(n+2) (or a next carry line connected to an output terminal of a next stage) and receive a carry signal of the next stage. The next stage may be a stage for receiving the carry signal later than the n-th stage STn, and may be, for example, an (n+2)th stage.

In one embodiment, each of the (p−1)th stage ST(p−1) and the p-th stage STp may not receive a carry signal of a next stage. Two dummy stages may be added to each of the (p−1)th stage ST(p−1) and the p-th stage STp to provide the carry signal of the next stage. In this case, however, space may be required to provide dummy stages. As will be described below with reference to FIG. 7, the scan driver 13 according to some exemplary embodiments of the invention may exclude the dummy stages and the corresponding space to accommodate same by using clock signals provided to the first and second carry clock input terminals CRIN1 and CRIN2.

The first output terminal OUT1 may be connected to an n-th carry line CRn and output the carry signal. The carry signal output from the first output terminal OUT1 may be provided to the next stage and the previous stage through the n-th carry line CRn.

The second output terminal OUT2 may be connected to an n-th scan line SCn and output the scan signal.

Similarly, the third output terminal OUT3 may be connected to an n-th sensing line SSn and output the sensing signal.

Hereinafter, the configuration of the n-th stage STn will be described in more detail.

Figure 6:
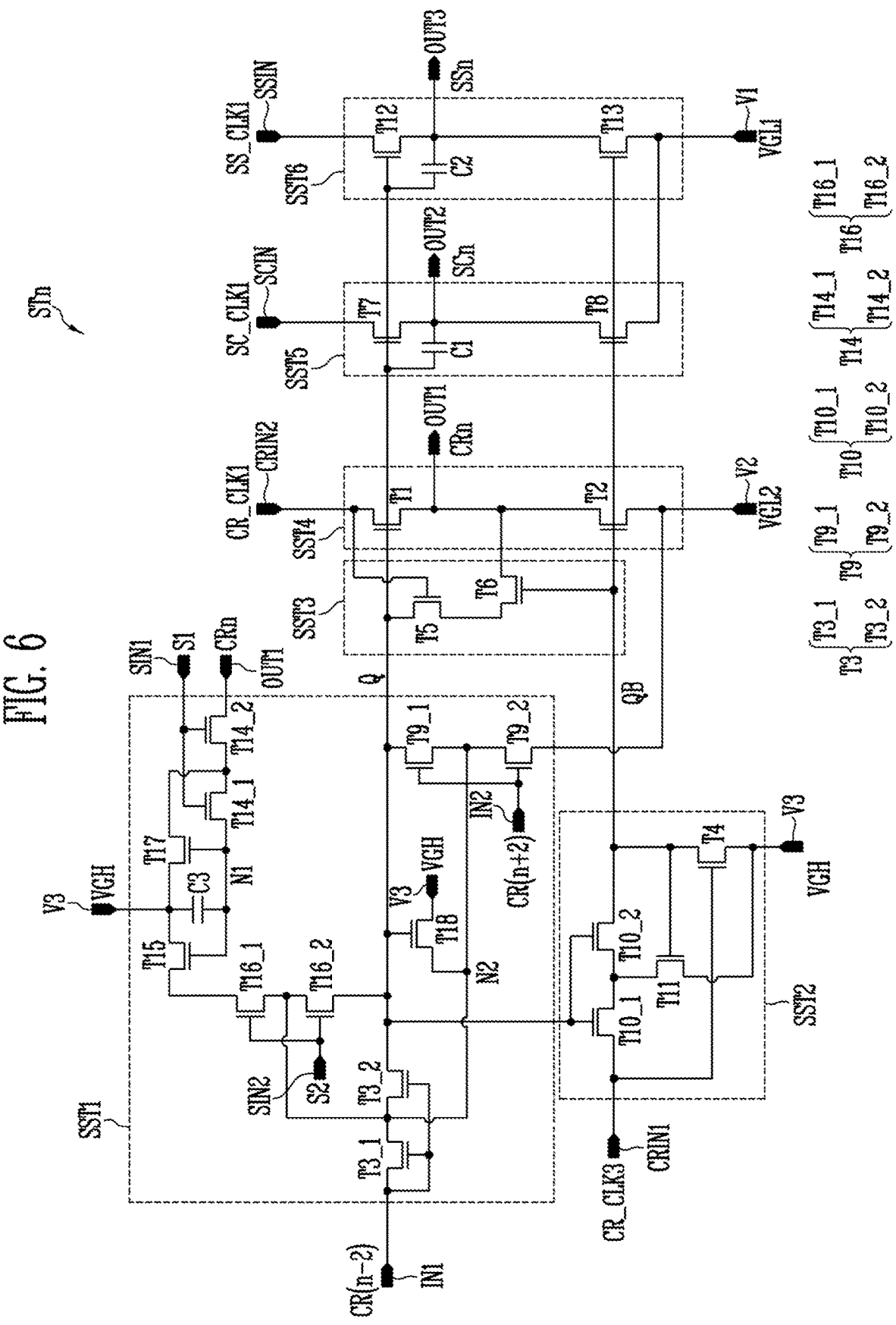
FIG. 6 is a circuit diagram of an exemplary embodiment of the stage shown in FIG. 5.

FIG. 6 is a circuit diagram of an exemplary embodiment of the stage shown in FIG. 5.

Referring to FIG. 6, the n-th stage STn (or the first stage) may include transistors T1 to T18 and capacitors C1 to C3. Hereinafter, an example in which the transistors T1 to T18 are configured as an N-type transistor (for example, an NMOS transistor) will be described. However, a person skilled in the art may configure the n-th stage STn by replacing some or all of the transistors T1 to T18 with a P-type transistor (for example, a PMOS transistor). In an exemplary embodiment, the n-th stage STn may includes a plurality of node controllers and output units. For example, as shown in FIG. 6, the n-th stage STn may include a first node controller SST1, a second node controller SST2, a third node controller SST3. Also, the n-th stage STn may include a first output unit SST4, a second output unit SST5, and a third output unit SST 6.

The first transistor T1 may include a first electrode connected to the first carry clock line CR_CLK1 through the second carry clock input terminal CRIN2, a second electrode connected to the n-th carry line CRn through the first output terminal OUT1, and a gate electrode connected to a Q node as a first control node.

The second transistor T2 may include a first electrode connected to the n-th carry line CRn, a second electrode connected to the second power line VGL2 through the second power input terminal V2, and a gate electrode connected to a QB node as a second control node.

The first output unit SST4 may include the first transistor T1 and the second transistor T2, and output the first carry clock signal provided through the first carry clock line CR_CLK1 as an n-th carry signal based on a node voltage of the Q node and a node voltage of the QB node.

The third transistor T3 may include a first electrode connected to the (n−2)th carry line CR(n−2) through the first input terminal IN1, a second electrode connected to the Q node, and a gate electrode connected to the (n−2)th carry line CR(n−2). The third transistor T3 may be included in the first node controller SST1 and control the node voltage of the Q node based on an (n−2)th carry signal.

The fourth transistor T4 may include a first electrode connected to the third power line VGH through the third power input terminal V3, a second electrode connected to the QB node, and a gate electrode connected to the third carry clock line CR_CLK3 through the first carry clock input terminal CRIN1. The fourth transistor T4 may be included in the second node controller SST2 and control the node voltage of the QB node based on a third clock signal.

In an exemplary embodiment, the third transistor T3 may include a first sub transistor T3_1 and a second sub transistor T3_2.

The first sub transistor T3_1 may include a first electrode connected to the (n−2)th carry line CR(n−2), a second electrode connected to a first electrode of the second sub transistor T3_2 (or a second node N2), and a gate electrode connected to the (n−2)th carry line CR(n−2). The second sub transistor T3_2 may include a first electrode connected to the second electrode of the first sub transistor T3_1 (or the second node N2), a second electrode connected to the Q node, and a gate electrode connected to the (n−2)th carry line CR(n−2).

The fifth transistor T5 may include a first electrode connected to the Q node, a second electrode connected to a first electrode of the sixth transistor T6, and a gate electrode connected to the first carry clock line CR_CLK1.

The sixth transistor T6 may include the first electrode connected to the second electrode of the fifth transistor T5, a second electrode connected to the n-th carry line CRn, and a gate electrode connected to the QB node.

The fifth transistor T5 and the sixth transistor T6 may constitute a third node controller SST3 and control the node voltage of the Q node based on the first carry clock signal and the node voltage of the QB node.

The seventh transistor T7 may include a first electrode connected to the first scan clock line SC_CLK1 through the scan clock input terminal SCIN, a second electrode connected to the n-th scan line SCn through the second output terminal OUT2, and a gate electrode connected to the Q node.

The eighth transistor T8 may include a first electrode connected to the n-th scan line SCn, a second electrode connected to the first power line VGL1 through the first power input terminal V1, and a gate electrode connected to the QB node.

The first capacitor C1 may be connected between the Q node and the n-th scan line SCn.

The seventh transistor T7, the eighth transistor T8, and the first capacitor C1 may constitute a second output unit SST5. The second output unit SST5 may output the first scan clock signal provided through the first scan clock line SC_CLK1 as an n-th scan signal based on the node voltage of the Q node and the node voltage of the QB node.

The ninth transistor T9 may include a first electrode connected to the Q node, a second electrode connected to the second power line VGL2, and a gate electrode connected to the (n+2)th carry line CR(n+2) through the second input terminal IN2. The ninth transistor T9 may provide or transfer the second power line VGL2 to the Q node in response to the (n+2)th carry signal of the (n+2)th carry line CR(n+2).

In an exemplary embodiment, the ninth transistor T9 may include a third sub transistor T9_1 and a fourth sub transistor T9_2.

The third sub transistor T9_1 may include a first electrode connected to the Q node, a second electrode connected to a first electrode of the fourth sub transistor T9_2 (or the second node N2), and a gate electrode connected to the (n+2)th carry line CR(n+2). The fourth sub transistor T9_2 may include a first electrode connected to the second electrode of the third sub transistor T9_1 (or the second node N2), a second electrode connected to the second power line VGL2, and a gate electrode connected to the (n+2)th carry line CR(n+2).

The tenth transistor T10 may include a first electrode connected to the third carry clock line CR_CLK3, a second electrode connected to the QB node, and a gate electrode connected to the Q node. The tenth transistor T10 may provide the third carry clock signal of the third carry clock line CR_CLK3 to the QB node in response to the node voltage of the Q node.

In an exemplary embodiment, the tenth transistor T10 may include a fifth sub transistor T10_1 and a sixth sub transistor T10_2.

The fifth sub transistor T10_1 may include a first electrode connected to the third carry clock line CR_CLK3, a second electrode connected to a first electrode of the sixth sub transistor T10_2, and a gate electrode connected to the Q node. The sixth sub transistor T10_2 may include a first electrode connected to the second electrode of the fifth sub transistor T10_1, a second electrode connected to the QB node, and a gate electrode connected to the Q node.

The eleventh transistor T11 may include a first electrode connected to the second electrode of the fifth sub transistor T10_1 (or the first electrode of the sixth sub transistor T10_2), a second electrode connected to the third power line VGH, and a gate electrode connected to the QB node.

The eleventh transistor T11 may connect the third power line VGH to the second electrode of the fifth sub transistor T10_1 in response to the node voltage of the QB node. When a voltage level of the QB node is a turn-on level, leakage current occurring through the sixth sub transistor T10_2 can be prevented.

The tenth transistor T10 and the eleventh transistor T11 may be included in the second node controller SST2, and control the node voltage of the QB node or maintain the node voltage of the QB node at a specific voltage level based on the node voltage of the Q node.

The twelfth transistor T12 may include a first electrode connected to the first sensing clock line SS_CLK1 through the sensing clock input terminal SSIN, a second electrode connected to the n-th sensing line SSn through the third output terminal OUT3, and a gate electrode connected to the Q node.

The thirteenth transistor T13 may include a first electrode connected to the n-th sensing line SSn, a second electrode connected to the first power line VGL1, and a gate electrode connected to the QB node.

The second capacitor C2 may be connected between the Q node and the n-th sensing line SSn.

The third output unit SST6 may include the twelfth transistor T12, the thirteenth transistor T13, and the second capacitor C2. The third output unit SST6 may output the first sensing clock signal provided through the first sensing clock line SS_CLK1 as an n-th sensing signal based on the node voltage of the Q node and the node voltage of the QB node.

The fourteenth transistor T14 may include a first electrode connected to the first node N1, a second electrode connected to the n-th carry line CRn, and a gate electrode connected to the first control line S1 through the first control signal input terminal SIN1.

In an exemplary embodiment, the fourteenth transistor T14 may include a seventh sub transistor T14_1 and an eighth sub transistor T14_2.

The seventh sub transistor T14_1 may include a first electrode connected to the first node N1, a second electrode connected to a first electrode of the eighth sub transistor T14_2, and a gate electrode connected to the first control line S1. The eighth sub transistor T14_2 may include the first electrode connected to the second electrode of the seventh sub transistor T14_1, a second electrode connected to the n-th carry line CRn, and a gate electrode connected to the first control line S1.

The third capacitor C3 may be connected between the third power line VGH and the first node N1. The fourteenth transistor T14 may transmit the n-th carry signal (that is, the carry signal applied to the n-th carry line CRn) to the first node N1 in response to the first control signal applied to the first control line S1. The third capacitor C3 may store the n-th carry signal.

The fifteenth transistor T15 may include a first electrode connected to the third power line VGH, a second electrode connected to a first electrode of the sixteenth transistor T16, and a gate electrode connected to the first node N1.

The sixteenth transistor T16 may include the first electrode connected to the second electrode of the fifteenth transistor T15, a second electrode connected to the Q node, and a gate electrode connected to the second control line S2 through the second control signal input terminal SIN2.

The fifteenth transistor T15 and the sixteenth transistor T16 may provide the voltage from a third power line VGH to the Q node based on the node voltage of the first node N1 and the second control signal of the second control line S2.

In an exemplary embodiment, the sixteenth transistor T16 may include a ninth sub transistor T16_1 and a tenth sub transistor T16_2.

The ninth sub transistor T16_1 may include a first electrode connected to the second electrode of the fifteenth transistor T15, a second electrode connected to a first electrode of the tenth sub transistor T16_2 (or the second node N2), and a gate electrode connected to the second control line S2. The tenth sub transistor T16_2 may include a first electrode connected to the second electrode of the ninth sub transistor T16_1 (or the second node N2), a second electrode connected to the Q node, and a gate electrode connected to the second control line S2.

The seventeenth transistor T17 may include a first electrode connected to the third power line VGH, a second electrode connected to the second electrode of the seventh sub transistor T14_1, and a gate electrode connected to the first node N1. The seventeenth transistor T17 may connect the third power line VGH to the second electrode of the seventh sub transistor T14_1 in response to the node voltage of the first node N1. When a voltage level of the first node N1 is a turn-on level, leakage current occurring through the seventh sub transistor T14_1 can be prevented.

The eighteenth transistor T18 may include a first electrode connected to the second node N2, a second electrode connected to the third power line VGH, and a gate electrode connected to the Q node. The eighteenth transistor T18 may connect the third power line VGH to the second node N2 in response to the node voltage of the Q node.

Figure 7:
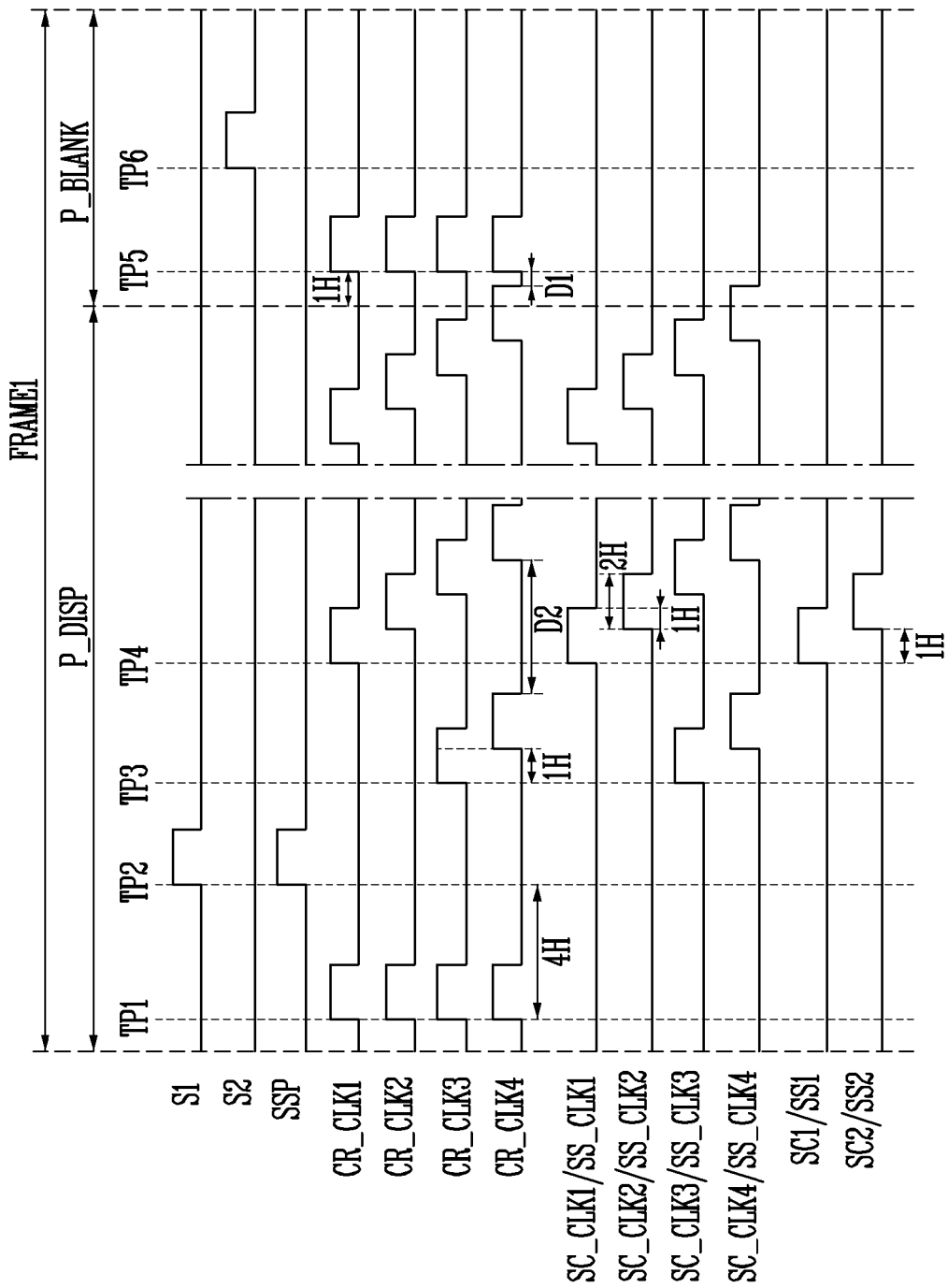
FIG. 7 is an exemplary timing diagram illustrating an example of a driving method of the stage shown in FIG. 6.

FIG. 7 is an exemplary timing diagram illustrating an example of a driving method of the stage shown in FIG. 6.

Referring to FIG. 7, signals measured in the first control line S1, the second control line S2, the carry clock lines CR_CLK1 to CR_CLK4, the scan clock lines SC_CLK1 to SC_CLK4, the sensing clock lines SS_CLK1 to SS_CLK4, the first scan line SC1, the second scan line SC2, the first sensing line SS1, and the second sensing line SS2 are shown. In other words, FIG. 7 shows a plurality of pulses corresponding to each of the signals which is applied to each of the first control line S1, the second control line S2, the carry clock lines CR_CLK1 to CR_CLK4, the scan clock lines SC_CLK1 to SC_CLK4, the sensing clock lines SS_CLK1 to SS_CLK4, the first scan line SC1, the second scan line SC2, the first sensing line SS1, and the second sensing line SS2.

In the driving period P_DISP, phases of the scan clock signal and the sensing clock signal applied to each of the scan clock lines SC_CLK1 to SC_CLK4 and the sensing clock lines SS_CLK1 to SS_CLK4 connected to the same stage may be the same. Accordingly, in FIG. 7, the signals of the first clock lines SC_CLK1 and SS_CLK1 are shown in common, the signals of the second clock lines SC_CLK2 and SS_CLK2 are shown in common, the signals of the third clock lines SC_CLK3 and SS_CLK3 are shown in common, and the signals of the fourth clock lines SC_CLK4 and SS_CLK4 are shown in common. In the same manner, in FIG. 7, the signals of the first scan line SC1 and the first sensing line SS1 are shown in common, and the signals of the second scan line SC2 and the second sensing line SS2 are shown in common since the phases of the scan signal and the sensing signal outputted from the same stage may be the same.

The scan clock signals applied to the scan clock lines SC_CLK1 to SC_CLK4 and the sensing clock signals applied to the sensing clock lines SS_CLK1 to SS_CLK4 may have a low level (or a logical low level) corresponding to the magnitude of the voltage applied to the first power line VGL1 and a high level (or a logic high level) corresponding to the magnitude of the voltage applied to the third power line VGH.

The carry clock signals applied to the carry clock lines CR_CLK1 to CR_CLK4 may have a low level corresponding to the magnitude of the voltage applied to the second power line VGL2 and a high level corresponding to the magnitude of the voltage applied to the third power line VGH. For example, the voltage applied to the second power line VGL2 may be smaller than the voltage applied to the first power line VGL1.

A voltage level of the third power line VGH may be large enough to turn on the transistors, and the voltages applied to the first and second power lines VGL1 and VGL2 may be high enough to turn off the transistors. Hereinafter, the voltage level corresponding to the magnitude of the voltage applied to the third power line VGH may be expressed as a high level, and the voltage level corresponding to the magnitude of the voltages applied to the first and second power lines VGL1 and VGL2 may be expressed as a low level.

High level pulses (or second pulses) applied to the second scan and sensing clock lines SC_CLK2 and SS_CLK2 may be delayed in phase than high level pulses (or first pulses) applied to the first scan and sensing clock lines SC_CLK1 and SS_CLK1 and partially overlapped in time. For example, the high level pulses may have a length (or width) of about 2 horizontal periods 2H, and the length at which the pulses overlap may correspond to about 1 horizontal period 1H. For example, the high level pulses applied to the second scan and sensing clock lines SC_CLK2 and SS_CLK2 may be delayed by 1 horizontal period 1H than the high level pulses applied to the first scan and sensing clock lines SC_CLK1 and SS_CLK1.

Similarly, high level pulses applied to the third scan and sensing clock lines SC_CLK3 and SS_CLK3 may be delayed in phase from the high level pulses applied to the second scan and sensing clock lines SC_CLK2 and SS_CLK2 and partially overlapped in time. In addition, high level pulses applied to the fourth scan and sensing clock lines SC_CLK4 and SS_CLK4 may be delayed in phase from the high level pulses applied to the third scan and sensing clock lines SC_CLK3 and SS_CLK3 and partially overlapped in time.

An operation of the n-th stage STn in the driving period P_DISP will be described below. Since operations of the other stages are similar to those of the n-th stage STn, repetitive descriptions will be omitted to avoid redundancy.

At a first time point TP1, that is, at the start of the driving period P_DISP, high level pulses (or fourth pulses) may be applied to the first to fourth carry clock lines CR_CLK1, CR_CLK2, CL_CLK3, and CL_CLK4. The high level pulses applied to each of the first to fourth carry clock lines CR_CLK1, CR_CLK2, CL_CLK3 and CL_CLK4 may have the same phase.

Since the high level pulse is applied to the third carry clock line CR_CLK3, the fourth transistor T4 may be turned on and the QB node may be charged to the high level. In addition, the second transistor T2, the eighth transistor T8, and the thirteenth transistor T13 may be turned on, the second power line VGL2 may be connected to the n-th carry line CRn, and the first power line VGL1 may be connected to the n-th scan line SCn and the n-th sensing line SSn.

Since the high level pulse is applied to the first carry clock line CR_CLK1, the fifth transistor T5 may be turned on. The sixth transistor T6 may be turned on in response to the node voltage of the QB node. Therefore, the Q node may be connected to the second power line VGL2 through the second transistor T2, the sixth transistor T6, and the fifth transistor T5 or the Q node may be discharged.

That is, the Q node may be reset by the high level pulses applied to the first to fourth carry clock lines CR_CLK1, CR_CLK2, CL_CLK3, and CL_CLK4 and having the same phase.

At a second time point TP2, the scan start signal SSP applied to the first stage ST1 (refer to FIG. 4) (and the second stage ST2) may have a high level pulse. The second time point TP2 may be about 4 horizontal periods 4H after the first time point TP1.

In addition, at the second time point TP2, a high level pulse may occur in the first control line S1. In this case, the fourteenth transistor T14 may be turned on, the n-th carry signal output through the n-th carry line CRn may be applied to the first node N1 through the fourteenth transistor T14, and the n-th carry signal may be written to the third capacitor C3 of the n-th stage STn. When the n-th carry signal has a high level voltage, the n-th stage STn may be selected as a stage to operate in a sensing period to be described later.

On the other hand, when the n-th carry signal has the high level voltage, remaining stages except the n-th stage STn (that is, remaining stages except the n-th stage STn among the first to p-th stages ST1 to STp described with reference to FIG. 4) may output a low level voltage through the carry lines. Therefore, the third capacitor C3 of the remaining stages may be discharged or reset to the low level.

At a third time point TP3, a high level pulse may be applied to the third carry clock line CR_CLK3, and then the high level pulse delayed by about 1 horizontal period 1H may be applied to the fourth carry clock line CR_CLK4. Thereafter, the high level pulses may be sequentially and periodically applied to the first carry clock line CR_CLK1, the second carry clock line CR_CLK2, the third carry clock line CR_CLK3, and the fourth carry clock line CR_CLK4.

In synchronization with the signals applied to the first to fourth carry clock lines CR_CLK1 to CR_CLK4, high level pulses may be sequentially and repeatedly applied to the first to fourth scan and sensing clock lines SC_CLK1 to SC_CLK4 and SS_CLK1 to SS_CLK4.

At a fourth time point TP4, high level pulses may be generated in the first carry clock line CR_CLK1, the first scan clock line SC_CLK1, and the first sensing clock line SS_CLK1. In this case, the node voltage of the Q node may be boosted higher than the high level by the first and second capacitors C1 and C2, and the high level pulses may be output to the n-th carry line CRn, the n-th scan line SCn, and the n-th sensing line SSn. For example, as shown in FIG. 7, the high level pulses may be output to the first scan line SC1 and the first sensing line SS1.

Despite the voltage boosting of the Q node, since the high level voltage is applied to the second node N2, a voltage difference between a drain electrode and a source electrode of the transistors T3, T9, and T16 may not be relatively large. Therefore, deterioration of the transistors T3, T9, and T16 can be prevented.

After the fourth time point TP4 (that is, during the driving period P_DISP after the fourth time point TP4), high level pulses may be sequentially output to the second to p-th scan lines SC2 to SCp (refer to FIG. 4), and the high level pulses may be sequentially output to the second to p-th sensing lines SS2 to SSp. For example, as shown in FIG. 7, at a time point after 1 horizontal period 1H from the fourth time point TP4, the high level pulses may be output to the second scan line SC2 and the second sensing line SS2.

Thereafter, at a fifth time point TP5, that is, at or after the end of the driving period P_DISP, high level pulses (or third pulses) may be applied to the first to fourth carry clock lines CR_CLK1, CR_CLK2, CL_CLK3, and CL_CLK4. The high level pulses applied to each of the first to fourth carry clock lines CR_CLK1, CR_CLK2, CL_CLK3, and CL_CLK4 may have the same phase. An operation of the n-th stage STn at the fifth time point TP5 may be substantially the same as the operation of the n-th stage STn at the first time point TP1. That is, the Q node may be reset by the high level pulses applied to the first to fourth carry clock lines CR_CLK1, CR_CLK2, CL_CLK3, and CL_CLK4 and having the same phase.

In an exemplary embodiment, the fifth time point TP5 may be a time point elapsed by an interval D1 smaller than the period of the pulses (that is, a clock cycle, D2) from the time point at which the last pulse among the pulses applied to the first to fourth carry clock lines CR_CLK1, CR_CLK2, CL_CLK3, and CL_CLK4 occurs.

In FIG. 7, the fifth time point TP5 is shown to be immediately after the driving period P_DISP ends (for example, a time point after about 1 horizontal period 1H from the end of the driving period P_DISP) or immediately after the blank period P_BLANK begins. However, the fifth time point TP5 is not limited thereto. The fifth time point TP5 may be the time point at the end of the driving period P_DISP or the time point at the start of the blank period P_BLANK. In other words, the end time (and a start time) of the driving period P_DISP may be defined by the fifth time point TP5.

At a sixth time point TP6, a high level pulse may occur in the second control line S2. In this case, the ninth transistor T16_1 and the tenth transistor T16_2 may be turned on.

An operation of the n-th stage STn after the sixth time point TP6 will be described in more detail with reference to FIG. 8.

Figure 8:
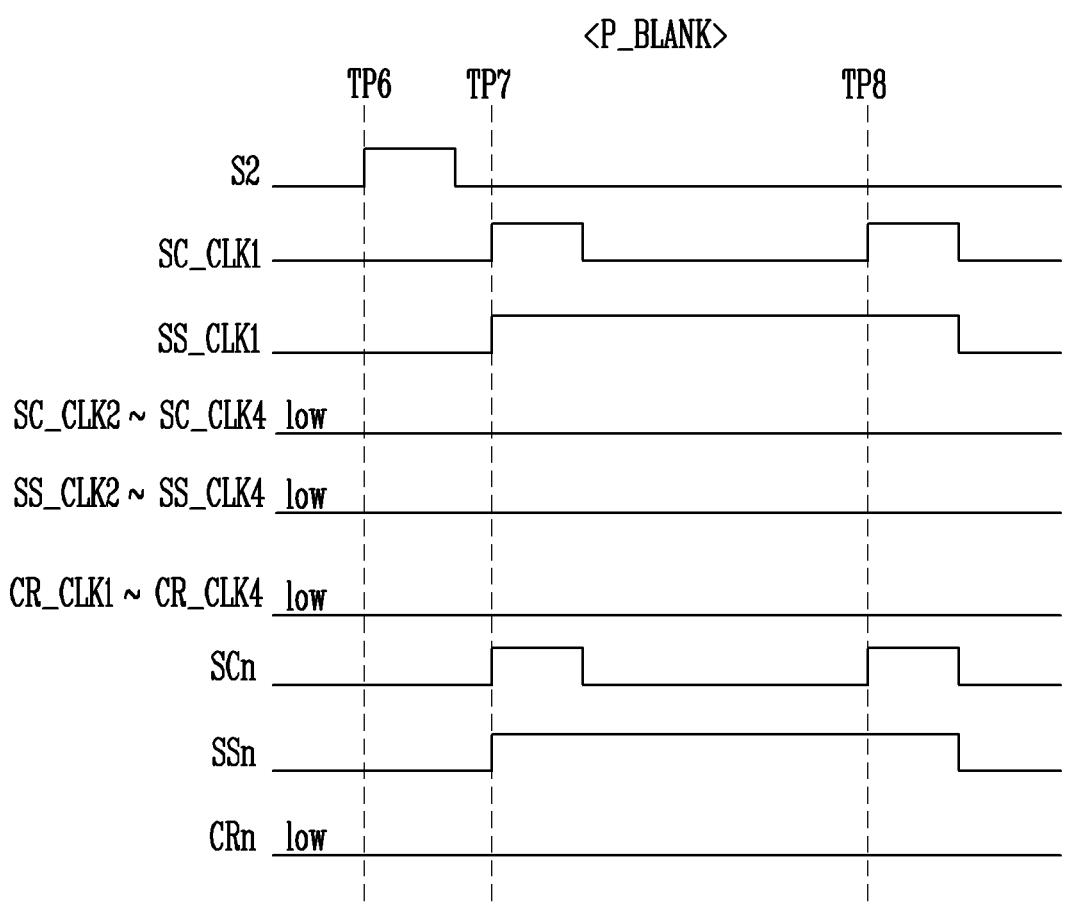
FIG. 8 is an exemplary timing diagram illustrating an example of a driving method in a sensing period of the stage shown in FIG. 6.

FIG. 8 is an exemplary timing diagram illustrating an example of a driving method in a sensing period of the stage shown in FIG. 6.

Referring to FIG. 8, signals applied to the second control line S2, the first scan clock line SC_CLK1, the first sensing clock line SS_CLK1, the second to fourth scan clock lines SC_CLK2 to SC_CLK4, the second to fourth sensing clock lines SS_CLK2 to SS_CLK4, the first to fourth carry clock lines CR_CLK1 to CR_CLK4, the n-th scan line SCn, and the n-th sensing line SSn are shown.

At the sixth time point TP6, the high level pulse may occur in the second control line S2. In this case, the sixteenth transistor T16 shown in FIG. 6 may be turned on. Since the third capacitor C3 (or the first node N1) is charged with a high level voltage during the driving period (that is, at the second time point TP2 described with reference to FIG. 7), the fifteenth transistor T15 may be turned on. Accordingly, the high level voltage charged in the third capacitor C3 may be applied to the Q node through the fifteenth transistor T15 and the sixteenth transistor T16.

At this time, since the node voltage of the first node N1 is at the low level in the other stages except the n-th stage STn, the node voltage of the Q node of the other stages may be maintained at the low level.

Thereafter, at a seventh time point TP7, high level signals may be applied to the first scan clock line SC_CLK1 and the first sensing clock line SS_CLK1. In this case, the node voltage of the Q node is boosted by the first and second capacitors C1 and C2 shown in FIG. 6, and the high level signals may be output to the n-th scan line SCn and the n-th sensing line SSn.

Therefore, the second and third thin film transistors M2 and M3 (refer to FIG. 2) of the pixel connected to the n-th scan line SCn and the n-th sensing line SSn may be turned on. As described with reference to FIG. 3, the sensing signal SDATA may be applied to the data line Dj, and the sensing unit 14 (refer to FIG. 1) may measure deterioration information or characteristic information of the pixels according to a current value or a voltage value received through the receiving line Rj.

In addition, since the nodes corresponding to the Q nodes in the other stages except the n-th stage STn are at the low level, even if the high level pulses are applied to the first scan clock line SC_CLK1 and the first sensing clock line SS_CLK1, low level signals may be output to the corresponding scan lines and the corresponding sensing lines.

At an eighth time point TP8, high level signals may be applied to the first scan clock line SC_CLK1 and the first sensing clock line SS_CLK1. In this case, the previous data signal may be applied to the data line Dj again. Accordingly, the pixel connected to the n-th scan line SCn and the n-th sensing line SSn may emit light with grayscale based on the previous data signal.

That is, during a period between the seventh time point TP7 and the eighth time point TP8, the pixel connected to the n-th scan line SCn and the n-th sensing line SSn may not emit light with grayscale based on the data signal. However, after the eighth time point TP8, the pixel connected to the n-th scan line SCn and the n-th sensing line SSn may emit light again with the grayscale based on the data signal. During the sensing period SP, the pixels connected to the other scan lines and the other sensing lines may emit light with gray scales based on the data signals. Therefore, there is no problem for the user in recognizing a frame.

Referring to FIG. 8, in a period between the seventh time point TP7 and the eighth time point TP8, deterioration information or characteristic information of the pixel connected to the n-th scan line SCn and the n-th sensing line SSn may be measured by applying the high level signal to the first scan clock line SC_CLK1 and the first sensing clock line SS_CLK1.

Referring to FIG. 7, at the first time point TP1, since the high level pulses having the same phase are applied to the first to fourth carry clock lines CR_CLK1, CR_CLK2, CL_CLK3 and CL_CLK4, the Q node of the n-th stage STn (that is, the Q node having the node voltage of the high level in the sensing period) may be reset. Similarly, at the first time point TP1, since the high level pulses having the same phase are applied to the first to fourth carry clock lines CR_CLK1, CR_CLK2, CL_CLK3 and CL_CLK4, the Q node of each of the first to n-th stages ST1 to STn (refer to FIG. 4) may be reset, and the scan driver 13 (refer to FIG. 4) may prepare for a sensing operation.

Figure 9:
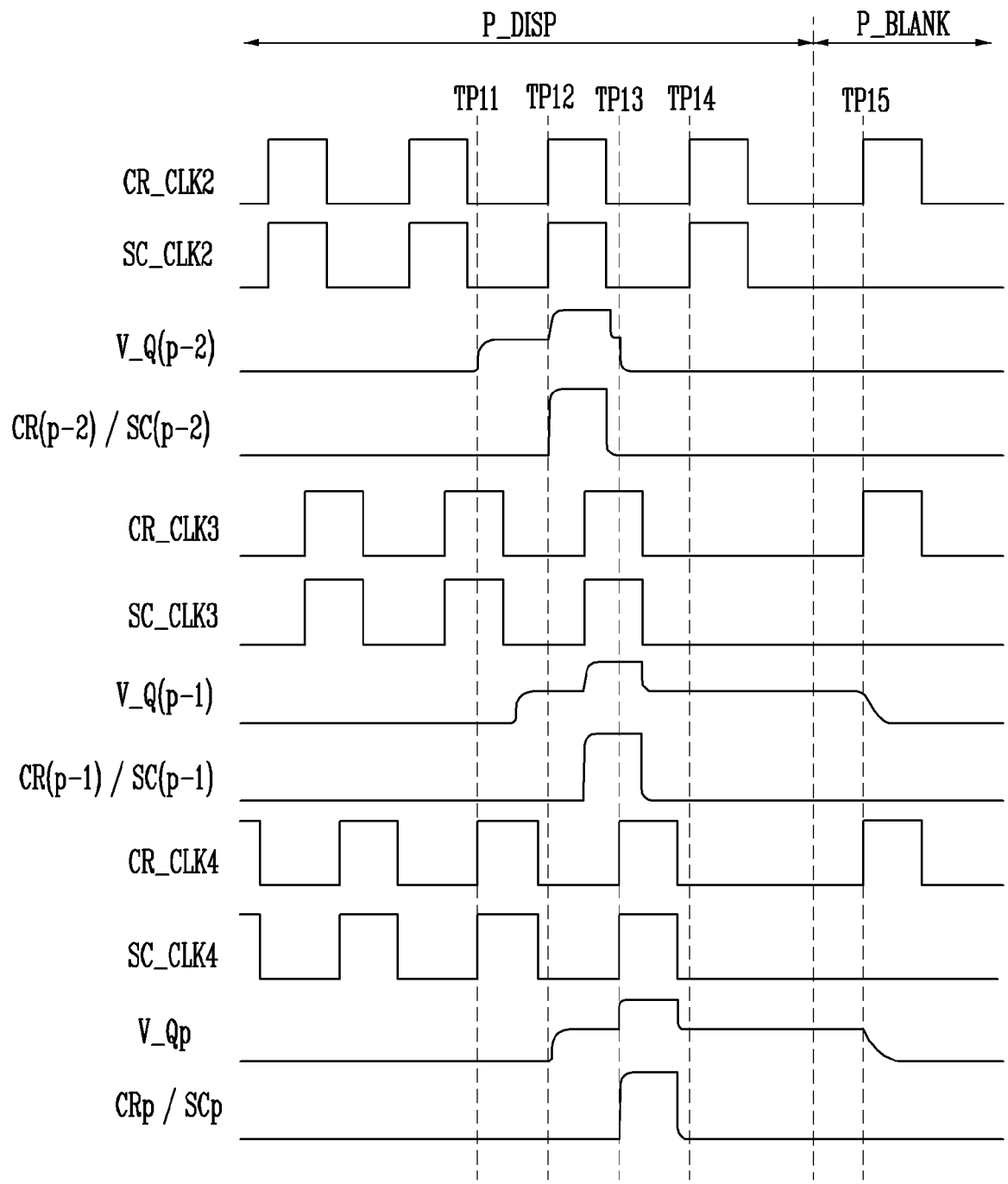
FIG. 9 is an exemplary timing diagram illustrating an example of a driving method of the scan driver of FIG. 4.

FIG. 9 is an exemplary timing diagram illustrating an example of a driving method of the scan driver of FIG. 4. A node voltage V_Q(p−2) of the Q node in a (p−2)th stage included in the scan driver 13 of FIG. 4, a signal applied to a (p−2)th carry line CR(p−2), a signal applied to a (p−2)th scan line SC(p−2), a node voltage V_Q(p−1) of the Q node in the (p−1)th stage ST(p−1), a signal applied to the (p−1)th carry line CR(p−1), a signal applied to the (p−1)th scan line SC(p−1), a node voltage V_Qp of the Q node in the p-th stage STp, a signal applied to the p-th carry line CRp, and a signal applied to the p-th scan line SCp are shown in FIG. 9.

Signals applied to the second to fourth carry clock lines CR_CLK2 to CR_CLK4 and the second to fourth scan clock lines SC_CLK2 to SC_CLK4 may be substantially the same as the signals applied to the second to fourth carry clock lines CR_CLK2 to CR_CLK4 and the second to fourth scan clock lines SC_CLK2 to SC_CLK4 described with reference to FIG. 7, respectively. Therefore, duplicate descriptions will not be repeated.

Hereinafter, an operation of the (p−2)th stage, an operation of the (p−1)th stage ST(p−1), and an operation of the p-th stage STp will be sequentially described based on the signals shown in FIG. 9.

The operation of the (p−2)th stage in a period between an eleventh time point TP11 to a thirteenth time point TP13 may be substantially the same as or similar to the operations of the n-th stage STn at the third time point TP3 and the fourth time point TP4 described with reference to FIG. 7. Therefore, duplicate descriptions will not be repeated.

At the eleventh time point TP11, a high level pulse may be generated in an (p−4)th carry line. Accordingly, the third transistor T3 of the (p−2)th stage may be turned on, and the node voltage V_Q(p−2) of the Q node of the (p−2)th stage may rise from the low level to the high level.

Thereafter, at a twelfth time point TP12, a high level pulse may be generated in the second carry clock line CR_CLK2. The node voltage V_Q(p−2) of the Q node of the (p−2)th stage may be boosted higher than the high level by the first and second capacitors C1 and C2, and high level pulses may be output to the (p−2)th carry line CR(p−2) and the (p−2)th scan line SC(p−2).

Subsequently, at the thirteenth time point TP13, a high level pulse may be generated in the p-th carry line CRp. Therefore, the ninth transistor T9 (refer to FIG. 6) of the (p−2)th stage may be turned on, and the node voltage V_Q(p−2) of the Q node of the (p−2)th stage may be discharged to the low level.

Next, since the operation of the (p−1)th stage ST(p−1) is similar to that of the (p−2)th stage, duplicate descriptions will not be repeated.

At the thirteenth time point TP13, the node voltage V_Q(p−1) of the Q node of the (p−1)th stage ST(p−1) may be boosted to the high level, and then may be transitioned to the high level in response to a transition of the signal applied to the third scan clock line SC_CLK3 (that is, a transition from the high level to the low level of the third scan clock signal).

At a fourteenth time point TP14, the node voltage V_Q(p−1) of the Q node of the (p−1)th stage ST(p−1) may be maintained at the high level.

As described with reference to FIG. 4, the (p−1)th stage ST(p−1) may not be connected to the carry line of the next stage (or does not receive the carry signal of the next stage). Therefore, the ninth transistor T9 (refer to FIG. 6) of the (p−1)th stage ST(p−1) may be turned off and the node voltage V_Q(p−1) of the Q node of the (p−1)th stage ST(p−1) may be maintained at the high level.

Therefore, when the high level pulse is applied to the third scan clock line SC_CLK3, an unintended high level pulse may be output through the (p−1)th scan line SC(p−1). Similarly, in a case where a signal having the high level pulse is applied to the (p−1)th stage ST(p−1) through the third scan clock line SC_CLK3 in the blank period P_BLANK (or the sensing period SP), for example, when the signal applied to the first scan clock line SC_CLK1 is applied to the (p−1)th stage ST(p−1) at the eighth time point TP8 described with reference to FIG. 8, the (p−1)th stage ST(p−1) may operate in the blank period P_BLANK even though the (p−1)th stage ST(p−1) is not a stage selected for sensing the characteristic information of the pixels.

According to some exemplary embodiments, at a fifteenth time point TP15, the high level pulses having the same phase may be applied to the carry clock lines CR_CLK2, CR_CLK3, and CR_CLK4 (or the first to fourth carry clock lines CR_CLK1, CR_CLK2, CR_CLK3, and CR_CLK4 shown in FIG. 4). Accordingly, the Q node of the (p−1)th stage ST(p−1) may be reset and unintended malfunctions of the (p−1)th stage ST(p−1) can be prevented in the blank period P_BLANK.

Next, since the operation of the p-th stage STp is substantially the same as that of the (p−1)th stage, duplicate descriptions will not be repeated.

At the thirteenth time point TP13, the node voltage V_Qp of the Q node of the p-th stage STp may be boosted to the high level, and then may be transitioned to the high level in response to a transition of the signal applied to the fourth scan clock line SC_CLK4 (that is, a transition from the high level to the low level of the fourth scan clock signal) at the fourteenth time point TP14.

At the fifteenth time point TP15, high level pulses having the same phase may be applied to the carry clock lines CR_CLK2, CL_CLK3, and CL_CLK4 (or the first to fourth carry clock lines CR_CLK1, CR_CLK2, CL_CLK3, and CL_CLK4 shown in FIG. 4). Accordingly, the Q node of the p-th stage STp may be reset and malfunctions of the p-th stage STp can be prevented in the blank period P_BLANK.

As described with reference to FIG. 9 (and FIG. 4), the carry signal of the next stage may not be provided to the (p−1)th stage ST(p−1) and the p-th stage STp, but the high level pulses may be applied to all the carry clock lines at the end of the driving period P_DISP (or an adjacent time point). According to the high level pulses applied to all the carry clock lines, the Q node of each of the (p−1)th stage ST(p−1) and the p-th stage STp may be transitioned or reset to the low level, and malfunctions of the (p−1)th stage ST(p−1) and the p-th stage STp can be prevented. Therefore, configurations for providing the carry signal of the next stage to each of the (p−1)th stage ST(p−1) and the p-th stage STp are unnecessary, and the scan driver 13 can be disposed in a narrower space.

Figure 10:
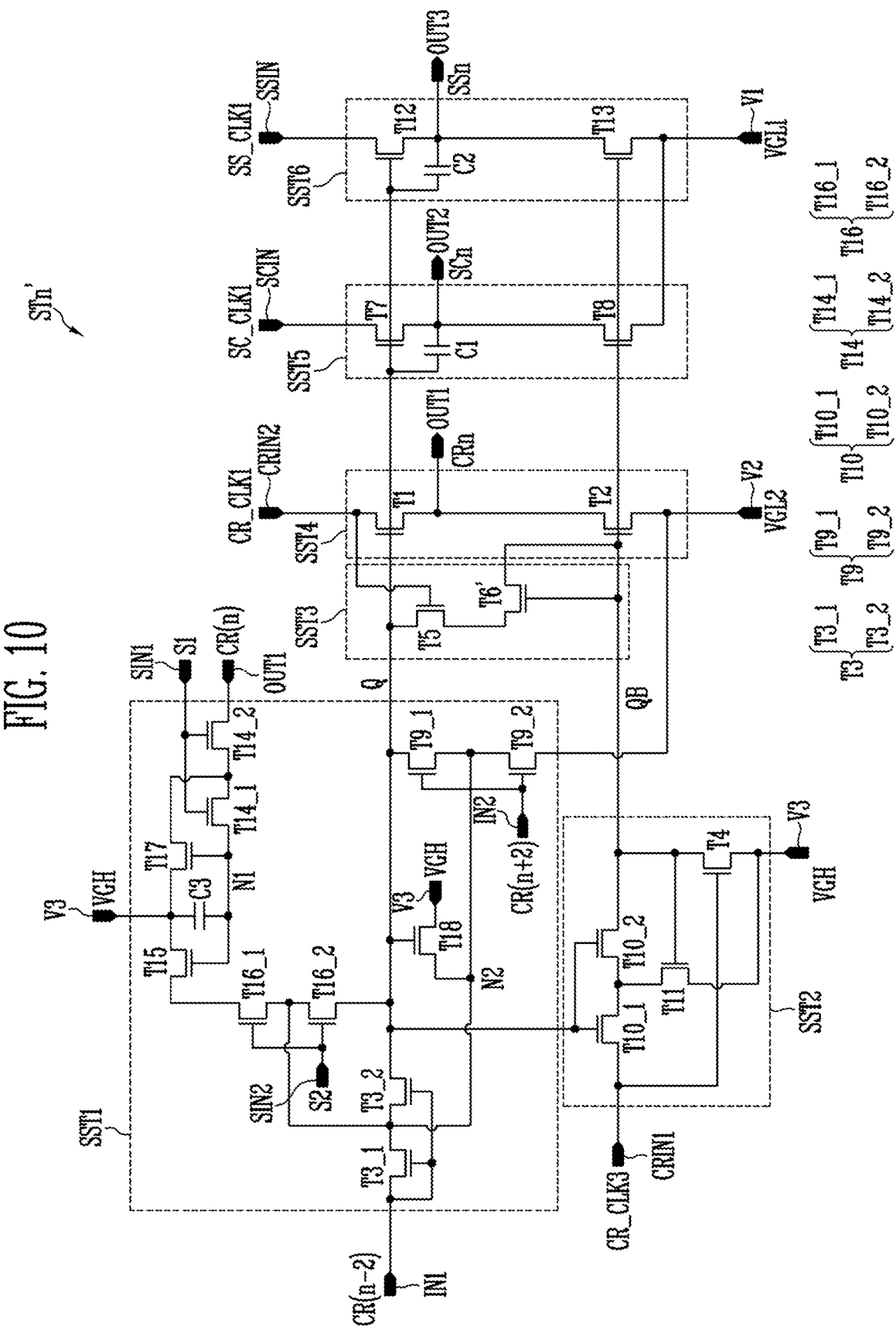
FIG. 10 is a circuit diagram of another exemplary embodiment of the stage shown in FIG. 5.

FIG. 10 is a circuit diagram of another exemplary embodiment of the stage shown in FIG. 5.

Referring to FIGS. 5, 6 and 10, compared to the n-th stage STn shown in FIG. 6, an n'-th stage STn' may include a sixth transistor T6'. Except for the sixth transistor T6', the n'-th stage STn' may be substantially the same as or similar to the n-th stage STn shown in FIG. 6. Therefore, duplicate descriptions will not be repeated.

The sixth transistor T6' may include a first electrode connected to the second electrode of the fifth transistor T5, a second electrode connected to the QB node, and a gate electrode connected to the QB node.

The sixth transistor T6' may constitute the third node controller SST3 together with the fifth transistor T5, and control the node voltage of the Q node based on the first carry clock signal applied to the first carry clock line CR_CLK1 and the node voltage of the QB node.

The scan driver according to some exemplary embodiments of the invention may include the plurality of stages, wherein the Q node and the QB node of each of the stages may be reset by the carry clock signals having the turn-on level at the same time. Thus, the scan driver does not require separate control signals and lines for resetting the Q node and the QB node, and the scan driver can be integrated in a narrower dead space.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A scan driver for a display device, the scan driver comprising:
a plurality of stages to output scan signals,
wherein a first stage of the plurality of stages comprises:
a first transistor having a first electrode connected to a first carry clock line, a second electrode connected to a carry line, and a gate electrode connected to a Q node;
a second transistor having a first electrode connected to the carry line, a second electrode connected to a first power line, and a gate electrode connected to a QB node;
a third transistor having a first electrode connected to a previous carry line, a second electrode connected to the Q node, and a gate electrode connected to the previous carry line;
a fourth transistor having a gate electrode connected to a second carry clock line and a first electrode connected to the QB node;
a fifth transistor having a first electrode connected to the Q node and a gate electrode connected to the first carry clock line; and
is a sixth transistor having a first electrode connected to a second electrode of the fifth transistor, a second electrode connected to the carry line, and a gate electrode connected to the QB node, and
wherein in a first frame period, the second carry clock line is configured to receive a second carry clock signal having at least one pulse with substantially the same phase as at least one of first pulses of a first carry clock signal to be applied to the first carry clock line.

2. The scan driver of claim 1, wherein the first frame period includes a driving period in which the stages are configured to sequentially output the scan signals,
wherein the at least one pulse includes a third pulse occurring at or after the end of the driving period, and
wherein the second carry clock signal further has pulses having phases different from the first pulses of the first carry clock signal in the driving period.

3. The scan driver of claim 2, wherein an interval between the third pulse and the second pulses is less than a period of the second pulses.

4. The scan driver of claim 2, wherein the at least one pulse includes a fourth pulse occurring at the start of the driving period.

5. The scan driver of claim 1, wherein the first stage further comprises:
a seventh transistor having a first electrode connected to a first scan clock line, a second electrode connected to a scan line, and a gate electrode connected to the Q node;
an eighth transistor having a first electrode connected to the scan line, a second electrode connected to a second power line, and a gate electrode connected to the QB node; and
a first capacitor connected between the Q node and the scan line.

6. The scan driver of claim 5, wherein the first stage further comprises a ninth transistor having a first electrode connected to the Q node and a gate electrode connected to a next carry line connected to the first power line.

7. The scan driver of claim 6, wherein the first stage further comprises a tenth transistor having a first electrode connected to the second carry clock line, a second electrode connected to the QB node, and a gate electrode connected to the Q node.

8. The scan driver of claim 7, wherein the tenth transistor comprises:
a first sub transistor having a first electrode connected to the second carry clock line and a gate electrode connected to the Q node; and
a second sub transistor having a first electrode connected to a second electrode of the first sub transistor, a second electrode connected to the QB node, and a gate electrode connected to the Q node, and
wherein the first stage further comprises a eleventh transistor having a first electrode connected to the second electrode of the first sub transistor, a second electrode connected to a third power line, and a gate electrode connected to the QB node.

9. The scan driver of claim 8, wherein the first stage further comprises:
a twelfth transistor having a first electrode connected to a first sensing clock line, a second electrode connected to a sensing line, and a gate electrode connected to the Q node;
a thirteenth transistor having a first electrode connected to the sensing line, a second electrode connected to the second power line, and a gate electrode connected to the QB node; and
a second capacitor connected between the Q node and the sensing line.

10. The scan driver of claim 9, wherein the first stage further comprises:
a fourteenth transistor having a first electrode connected to a first node, a second electrode connected to the carry line, and a gate electrode connected to a first control line;
a third capacitor connected between the third power line and the first node;
a fifteenth transistor having a first electrode connected to the third power line, and a gate electrode connected to the first node; and
a sixteenth transistor having a first electrode connected to a second electrode of the fifteenth transistor, a second electrode connected to the Q node, and a gate electrode connected to a second control line.

11. The scan driver of claim 10, wherein the fourteenth transistor comprises:
a third sub transistor having a first electrode connected to the first node, and a gate electrode connected to the first control line; and
a fourth sub transistor having a first electrode connected to a second electrode of the third sub transistor, a second electrode connected to the carry line, and a gate electrode connected to the first control line, and
wherein the first stage further comprises a seventeenth transistor having a first electrode connected to the third power line, a second electrode connected to the second electrode of the third sub transistor, and a gate electrode connected to the first node.

12. The scan driver of claim 11, wherein the third transistor comprises:
a fifth sub transistor having a first electrode connected to the previous carry line, a second electrode connected to a second node, and a gate electrode connected to the previous carry line; and
a sixth sub transistor having a first electrode connected to the second electrode of the fifth sub transistor, a second electrode connected to the Q node, and a gate electrode connected to the previous carry line, wherein the ninth transistor comprises:
  a seventh sub transistor having a first electrode connected to the Q node, a second electrode connected to the second node, and a gate electrode connected to the next carry line; and
  an eighth sub transistor having a first electrode connected to the second electrode of the seventh sub transistor, a second electrode connected to the first power line, and a gate electrode connected to the next carry line,
wherein the sixteenth transistor comprises:
  a ninth sub transistor having a first electrode connected to the first electrode of the fifteenth transistor, a second electrode connected to the second node, and a gate electrode connected to the second control line; and
  a tenth sub transistor having a first electrode connected to the second electrode of the ninth sub transistor, a second electrode connected to the Q node, and a gate electrode connected to the second control line, and
wherein the first stage further comprises an eighteenth transistor having a first electrode connected to the second node, a second electrode connected to the third power line, and a gate electrode connected to the Q node.

13. The scan driver of claim 7, wherein the stages comprise odd-numbered stages and even-numbered stages, and
  wherein, when the first stage is included in the odd-numbered stages, the first stage is connected to a previous stage and a next stage of the odd-numbered stages through the previous carry line and the next carry line, respectively.

14. The scan driver of claim 13, wherein the last stage of the stages is not connected to the next carry line.

15. The scan driver of claim 14, wherein a node voltage of the Q node of the last stage of the stages is changed from a high level to a low level by the at least one pulse having substantially the same phase.

16. A scan driver for a display device, the scan driver comprising:
  a plurality of stages to output scan signals,
  wherein a first stage of the plurality of stages comprises:
    a first transistor having a first electrode connected to a first carry clock line, a second electrode connected to a carry line, and a gate electrode connected to a Q node;
    a second transistor having a first electrode connected to the carry line, a second electrode connected to a first power line, and a gate electrode connected to a QB node;
    a third transistor having a first electrode connected to a previous carry line, a second electrode connected to the Q node, and a gate electrode connected to the previous carry line;
    a fourth transistor having a gate electrode connected to a second carry clock line and a first electrode connected to the QB node;
    a fifth transistor having a first electrode connected to the Q node and a gate electrode connected to the first carry clock line; and
    a sixth transistor having a first electrode connected to a second electrode of the fifth transistor, a second electrode connected to the QB node, and a gate electrode connected to the QB node, and
  wherein in a first frame period, the second carry clock line is configured to receive a second carry clock signal having at least one pulse with substantially the same phase as at least one of first pulses of a first carry clock signal to be applied to the first carry clock line.

17. A display device comprising:
  a pixel unit including scan lines and pixels connected to the scan lines;
  a scan driver including a plurality of stages providing scan signals to the scan lines; and
  a controller configured to provide a clock signal and a control signal to the scan driver,
  wherein a first stage of the plurality of stages comprises:
    a first transistor having a first electrode connected to a first carry clock line, a second electrode connected to a carry line, and a gate electrode connected to a Q node;
    a second transistor having a first electrode connected to the carry line, a second electrode connected to a first power line, and a gate electrode connected to a QB node;
    a third transistor having a first electrode connected to a previous carry line, a second electrode connected to the Q node, and a gate electrode connected to the previous carry line;
    a fourth transistor having a gate electrode connected to a second carry clock line and a first electrode connected to the QB node;
    a fifth transistor having a first electrode connected to the Q node and a gate electrode connected to the first carry clock line;
    a sixth transistor having a first electrode connected to a second electrode of the fifth transistor, a second electrode connected to the QB node, and a gate electrode connected to the QB node;
    a seventh transistor having a first electrode connected to a first scan clock line, a second electrode connected to a scan line, and a gate electrode connected to the Q node;
    an eighth transistor having a first electrode connected to the scan line, a second electrode connected to a second power line, and a gate electrode connected to the QB node; and
    a first capacitor connected between the Q node and the scan line, and
  wherein in a first frame period, the timing controller is configured to generate a second carry clock signal on the second carry clock line, with the second carry clock signal having at least one pulse with substantially the same phase as at least one of first pulses of a first carry clock signal to be applied to the first carry clock line.

18. The display device of claim 17, wherein the first frame period comprises a driving period in which the scan signals are sequentially output, and
  wherein the at least one pulse includes a third pulse occurring at or after the end of the driving period.

19. The display device of claim 17, wherein the pixel unit further comprises sensing lines connected to the pixels,
  wherein the scan driver is configured to apply sensing signals to the sensing lines, and
  wherein each of the pixels comprises:
    a first thin film transistor having a first electrode connected to a first power source, a second electrode connected to a source node, and a gate electrode connected to a gate node;
    a second thin film transistor having a first electrode connected to a data line, a second electrode connected to the gate node, and a gate electrode connected to one of the scan lines;

a third thin film transistor having a first electrode connected to a receiving line, a second electrode connected to the source node, and a gate electrode connected to one of the sensing lines;

a storage capacitor connected between the gate node and the source node; and a light emitting device connected between the source node and a second power source.

20. The display device of claim 19, wherein the first stage further comprises:

a twelfth transistor having a first electrode connected to a first sensing clock line, a second electrode connected to a sensing line, and a gate electrode connected to the Q node;

a thirteenth transistor having a first electrode connected to the sensing line, a second electrode connected to the second power line, and a gate electrode connected to the QB node;

a second capacitor connected between the Q node and the sensing line;

a fourteenth transistor having a first electrode connected to a first node, a second electrode connected to the carry line, and a gate electrode connected to a first control line;

a third capacitor connected between a third power line and the first node;

a fifteenth transistor having a first electrode connected to the third power line, and a gate electrode connected to the first node; and a sixteenth transistor having a first electrode connected to a second electrode of the fifteenth transistor, a second electrode connected to the Q node, and a gate electrode connected to a second control line.

* * * * *